United States Patent
Lundskog et al.

(10) Patent No.: US 9,103,117 B1
(45) Date of Patent: Aug. 11, 2015

(54) MECHANICAL DROP-AWAY CEILING

(71) Applicant: WINDCHILL ENGINEERING, INC., Orem, UT (US)

(72) Inventors: David Alan Lundskog, American Fork, UT (US); John Roy North, Keene, NH (US); Lane Mack Lewis, Jr., Draper, UT (US)

(73) Assignee: WINDCHILL ENGINEERING, INC., Orem, UT (US)

( * ) Notice: Subject to any disclaimer, the term of this patent is extended or adjusted under 35 U.S.C. 154(b) by 0 days.

(21) Appl. No.: 14/193,958

(22) Filed: Feb. 28, 2014

Related U.S. Application Data (60) Provisional application No. 61/770,815, filed on Feb. 28, 2013.

(51) Int. Cl.
*E04B 9/00* (2006.01)
*E04B 1/94* (2006.01)

(52) U.S. Cl.
CPC ...................... *E04B 1/941* (2013.01)

(58) Field of Classification Search
CPC ........... E04B 1/941; E04B 9/00; E04B 9/003; A47B 46/00
USPC ............... 52/1, 506.04, 506.06, 302.1, 302.3, 52/506.03
See application file for complete search history.

(56) References Cited

U.S. PATENT DOCUMENTS

| | | | |
|---|---|---|---|
| 3,720,432 A * | 3/1973 | Chudler ........................ | 292/220 |
| 4,332,005 A * | 5/1982 | McCall ......................... | 362/150 |
| 4,867,376 A | 9/1989 | Arceneaux et al. | |
| 5,619,824 A * | 4/1997 | Russell et al. ...................... | 52/1 |
| 6,059,424 A * | 5/2000 | Kotloff .......................... | 362/220 |
| 6,449,917 B1 * | 9/2002 | Sullivan, III ............... | 52/506.06 |
| 2010/0289428 A1 * | 11/2010 | Frazier et al. ................. | 315/294 |
| 2010/0311317 A1 | 12/2010 | McReynolds et al. | |
| 2011/0256823 A1 | 10/2011 | Ludmann | |
| 2012/0240495 A1 | 9/2012 | Eychaner et al. | |

FOREIGN PATENT DOCUMENTS

| | | |
|---|---|---|
| CA | 2738488 A1 | 11/2012 |
| GB | 2454239 A | 5/2009 |

OTHER PUBLICATIONS

Liebman, Andrew, "Polargy PolarPlex Drop Away Panels", downloaded from http://www.processor.com/editorial/article.asp?article=articles%2Fp3223%2F54p23%2F54p23.asp on Jan. 18, 2013, Processor vol. 32, Issue 23, Nov. 5, 2010, 1 pg.

"Drop Ceiling Release Solution in a Data Centre", http://www.youtube.com/watch?v=3ir2k40BWxl, downloaded from http://www.youtube.com/watch?v=3ir2k40BWxl on Jan. 21, 2013, Jan. 17, 2012, 2 pgs.

"Shrink-Away Ceiling", downloaded from http://www.windchillengineering.com/wp-content/uploads/2012/08/Spec-Sheet-Shrink-Away-Panel-10_11_12-1.pdf on Jan. 18, 2013, 2 pgs.

"Curtain Walls", downloaded from http://sealco.net/products/curtain-walls/ on Jan. 21, 2013, 1 pg.

* cited by examiner

*Primary Examiner* — Jeanette E Chapman
(74) *Attorney, Agent, or Firm* — Maschoff Brennan

(57) ABSTRACT

A mechanical drop-away ceiling may include a frame and a panel. The frame may be configured to be suspended above a floor. The frame may include a movable element movable between a closed position and an open position. The panel may be selectively retained at the frame by the movable element in the closed position and may be free to drop away from the frame when the movable element is in the open position.

19 Claims, 8 Drawing Sheets

MECHANICAL DROP-AWAY CEILING

CROSS-REFERENCE TO RELATED APPLICATIONS

This patent application claims the benefit of and priority to U.S. Provisional Patent Application No. 61/770,815, filed Feb. 28, 2013.

FIELD

The embodiments discussed herein are related to mechanical drop-away ceilings.

BACKGROUND

A data center is a facility which houses computer systems and associated components such as telecommunications and storage systems. Data centers may include redundant or backup power supplies for a computer system, redundant data communications connections and environmental controls including air conditioning and fire suppression systems.

When ceiling panels are utilized to isolate and contain zones or cooled air, the ceiling panels may become a barrier to the fire suppression systems. In particular, fire suppression systems arranged above the ceiling panels may be unable to dispense fire suppressant to areas beneath or otherwise blocked by the ceiling panels in the event of a fire.

The subject matter claimed herein is not limited to embodiments that solve any disadvantages or that operate only in environments such as those described above. Rather, this background is only provided to illustrate one example technology area where some embodiments described herein may be practiced.

BRIEF SUMMARY OF SOME EXAMPLE EMBODIMENTS

Example embodiments discussed herein are related to mechanical drop-away ceilings.

In an example embodiment, a mechanical drop-away ceiling includes a frame and a panel. The frame is configured to be suspended above a floor. The frame includes a movable element movable between a closed position and an open position. The panel is selectively retained at the frame by the movable element in the closed position and is free to drop away from the frame when the movable element is in the open position.

In another example embodiment, a mechanical drop-away ceiling includes a frame, a panel, an actuator assembly, a sensor, and a controller. The frame is configured to be suspended above a floor of an aisle. For example, the frame may be suspended above the floor between opposing rows of racks in a data center or computer room. The frame includes a first end support configured to rest on a server rack defining one side of the aisle and a first rotatable shelf rotatably coupled to the first end support. The frame also includes a second support substantially parallel to the first end support and configured to rest on a second server rack defining an opposite side of the aisle, and a second rotatable shelf rotatably coupled to the second support. The frame also includes a first cross beam coupled between the first end support and the second end support and a third rotatable shelf rotatably coupled to the first cross beam. The frame also includes a second cross beam spaced apart from the first cross beam and coupled between the first end support and the second end support, and a fourth rotatable shelf rotatably coupled to the second cross beam. The panel is selectively retained at the frame by the rotatable shelves in closed positions and is free to drop away from the frame when the rotatable shelves are in open positions. The actuator assembly is mounted to the first end support and is operatively coupled to the first rotatable shelf. The sensor is configured to detect smoke, heat, flames, or any combination thereof. The controller is communicatively coupled to the sensor and to the actuator assembly and is configured to control the actuator assembly in response to sensor signals generated by the sensor. The actuator assembly is operable to rotate the first rotatable shelf between the closed position and the open position.

In another example embodiment, a method of operating a drop-away ceiling includes retaining, by an actuator assembly operatively coupled to a movable element of a frame suspended above a floor, the movable element in a closed position that is effective to suspend a ceiling panel above the floor. The method may also include receiving a sensor signal indicative of an environmental parameter within an environment of the drop-away ceiling. The method may also include determining that the sensor signal satisfies a particular criterion. The method may also include, in response to the sensor signal satisfying the particular criterion, the actuator assembly moving the movable element to an open position that is effective to release the ceiling panel to fall downward. The method may also include the ceiling panel falling downward. For example, the ceiling panel may fall to the floor. Alternately or additionally, the ceiling panel may fall toward the floor without reaching the floor if, for instance, the ceiling panel is secured to a lanyard.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Some embodiments described herein generally relate to a mechanical drop-away ceiling that may be used in, e.g., a data center, a parts storage facility, or the like. The mechanical drop-away ceiling includes panels that are selectively retained in the ceiling. The mechanical drop-away ceiling may be electronically controlled and/or may include one or more sensors such that, in response to detecting smoke, excessive heat, and/or flames, the panels may be released to drop away toward the floor. The panels may be released by the movement of one or more electronically-controlled movable elements, rather than by the shrinking and/or melting of a thermosensitive component.

Alternately or additionally, the panels may include heat-activated panels, e.g., panels made of or including thermosensitive materials. In these and other embodiments, the inclusion of heat-activated panels may provide fault tolerance. In particular, the panels may be configured to shrink or otherwise melt in such a way that the panels fall downward even if the mechanical drop-away ceiling experiences a mechanical failure. According to some embodiments, the material used in heat-activated panels may be relatively light and less likely to cause injury to a person standing underneath when the panels fall downward from the mechanical drop-away ceiling.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1:
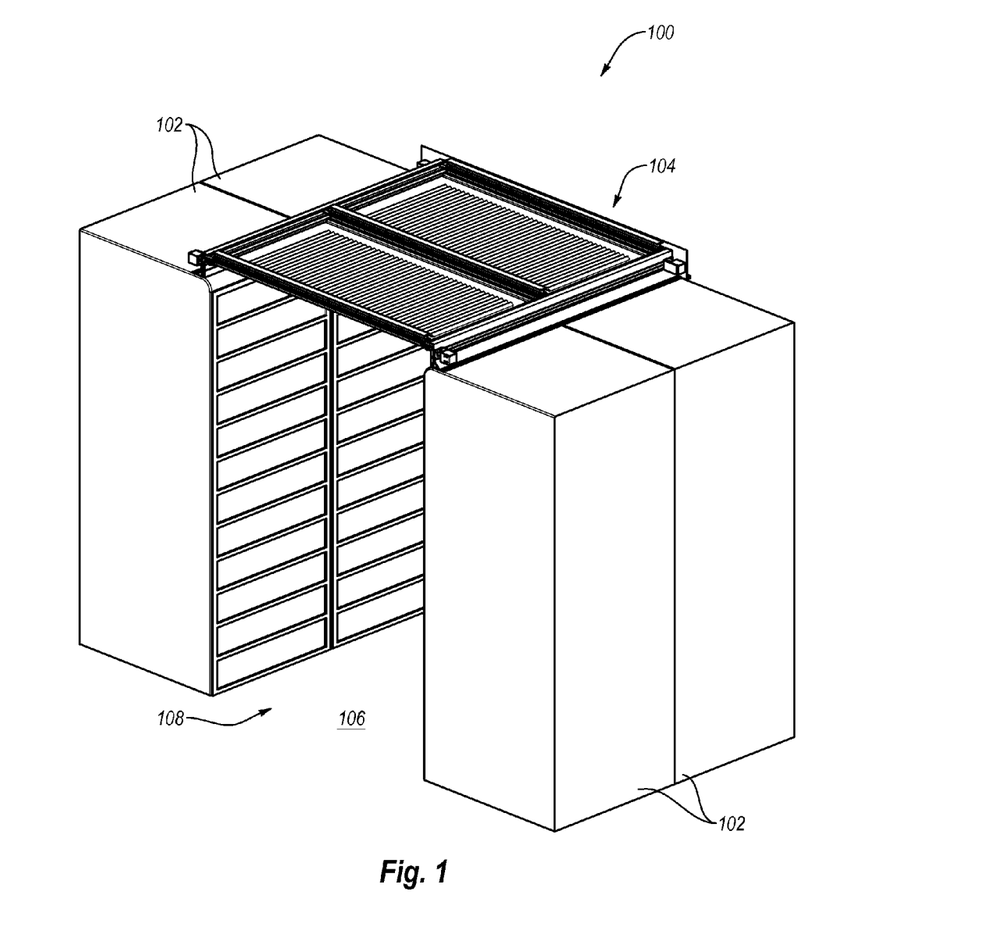
FIG. 1 illustrates an example operating environment in which some embodiments described herein may be implemented.

FIG. 1 illustrates an example operating environment 100 in which some embodiments described herein may be implemented. The operating environment 100 may include a data center or computer room, for example. As illustrated, the operating environment 100 includes one or more server racks 102 and a mechanical drop-away ceiling 104 (hereinafter "drop-away ceiling 104") suspended above a floor 106 of an aisle 108 defined by the server racks 102. In general, the server racks 102 support the drop-away ceiling 104. A frame of the drop-away ceiling 104 may rest on the server racks 102 and/or may be coupled to the server racks 102 using adhesive, fasteners, or other suitable mechanical couplers.

The operating environment 100 of FIG. 1 is not meant to be limiting. For example, while the operating environment 100 of FIG. 1 is a data center, more generally embodiments of the drop-away ceiling 104 described herein may be implemented in any environment where aisles are enclosed and a removable ceiling would be of value to, e.g., meet fire codes, to control airflow (e.g., for HVAC or in data centers with cooling needs), or the like or any combination thereof. Accordingly, embodiments of the drop-away ceiling 104 may be implemented in a data center as illustrated in FIG. 1, in a parts storage facility, or any other environment where a removable ceiling would be of value.

Figure 2A:
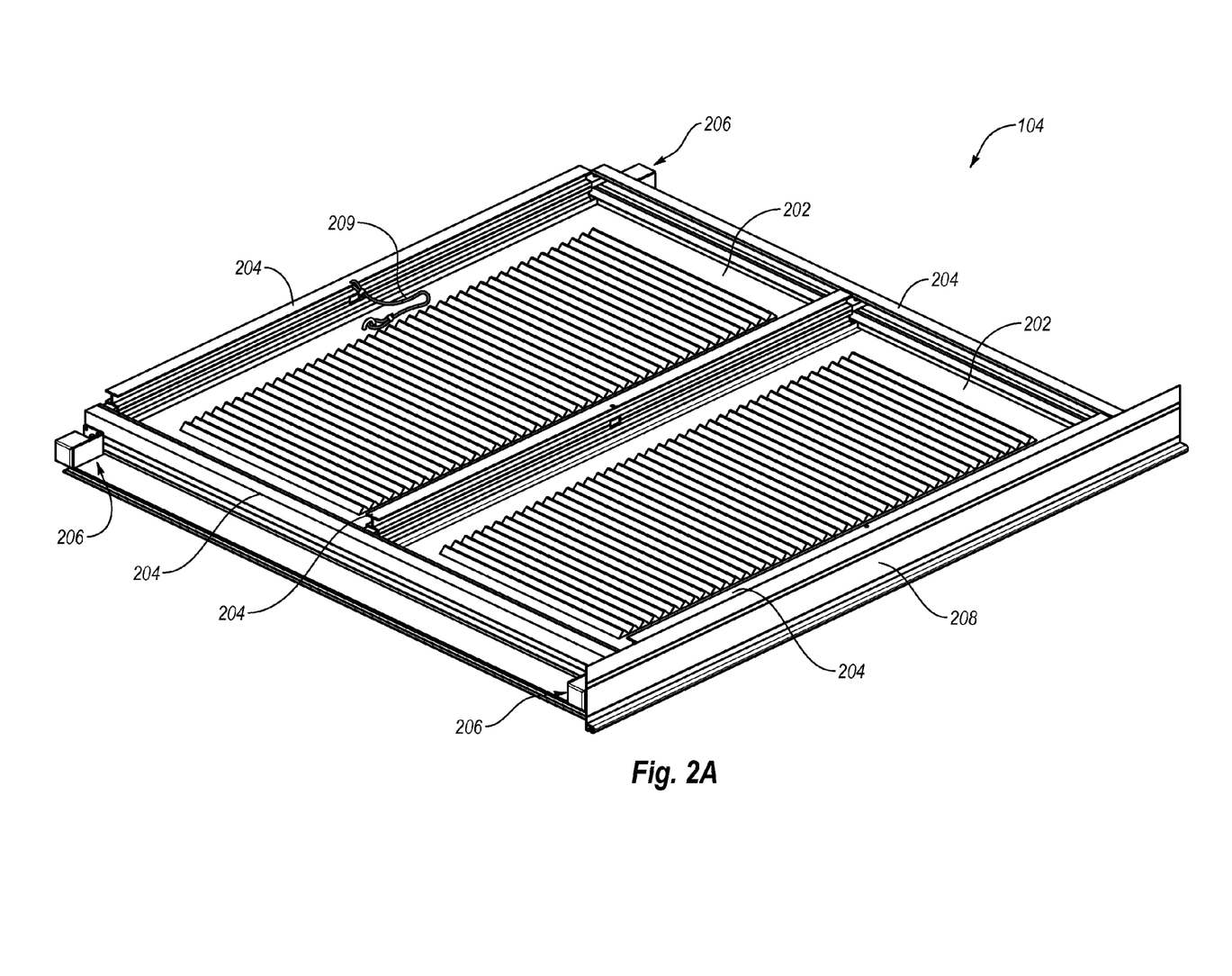
FIGS. 2A-2B include views of a mechanical drop-away ceiling (hereinafter "drop-away ceiling") that may be implemented in the operating environment of FIG. 1.
Figure 2B:
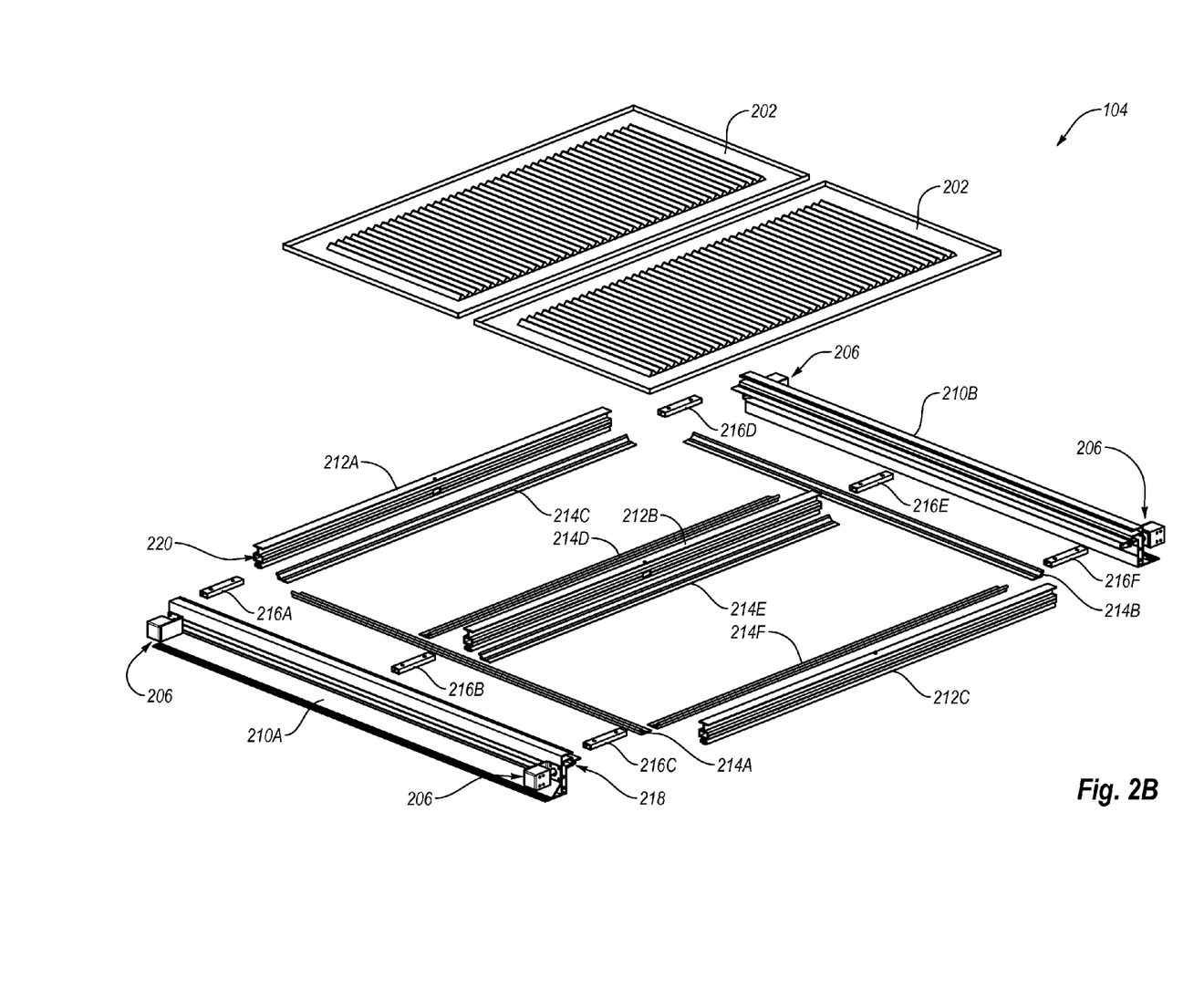

FIGS. 2A-2B include views of the drop-away ceiling 104 of FIG. 1. In particular, FIG. 2A is a perspective view of the drop-away ceiling 104, and FIG. 2B is a partially exploded perspective view of the drop-away ceiling 104. As illustrated in FIG. 2A, the drop-away ceiling 104 includes panels 202 and a frame generally designated at 204. The drop-away ceiling 104 additionally includes actuator assemblies 206 mounted to the frame 204 at each of its four corners, although only three of the actuator assemblies 206 are visible in the view of FIG. 2A. The panels 202 may include one or more of polyvinyl panels, heat-activated panels, FM rated panels, and/or UL listed panels for use under fire suppression systems.

Optionally, the drop-away ceiling 104 may further include a valence 208 mounted to the frame 204.

Alternately or additionally, the drop-away ceiling 104 may further include one or more lanyards 209. One end of the lanyard 209 may be coupled to the frame 204 while the other end of the lanyard 209 may be coupled to one of the panels 202. The lanyard may be configured to allow the panel 202 to which it is attached to fall downward away from the frame 204 without falling all the way to the floor. For instance, a length of the lanyard 209 may be selected to arrest the downward motion of the panel 202 as it is falling away from the frame 204 so that the panel 202 does not hit the floor at all, or does not fall completely to the floor. Although a single lanyard 209 is illustrated in FIG. 2A, more generally, the drop-away ceiling 104 may include one or more lanyards 209, such as one lanyard 209 per panel 202. Moreover, while the lanyard 209 is only illustrated in FIG. 2A, one or more lanyards may be implemented with any of the drop-away ceilings disclosed herein.

As will be described in more detail below, the frame 204 includes at least one movable element movable between a closed position and an open position such that the panels 202 may be selectively retained at the frame 204 by the movable element in the closed position and may be free to drop away from the frame when the movable element is in the open position.

Modifications, additions, and/or omissions may be made to the drop-away ceiling 104 of FIG. 2A and other Figures herein without departing from the scope of the claims. For example, the drop-away ceiling 104 may have more or fewer panels 202 than two with the same or different aspect ratio or features than disclosed herein. Alternately or additionally, the drop-away ceiling 104 may have more or fewer actuator assemblies 206 that may be mounted at the same or different locations than disclosed herein. For example, the drop-away ceiling 104 may have a single actuator assembly 206 to control the release of up to four or more or fewer panels 202 as will be described below.

With reference now to FIG. 2B, the frame 204 may include, but is not limited to, first and second end supports 210A, 210B (collectively "end supports 210"); first, second, and/or third cross beams 212A, 212B, 212C (collectively "cross beams 212"); and a plurality of movable elements 214A-214F. Although particular numbers of end supports 210, cross beams 212, and movable elements 214A-214F are illustrated in FIG. 2B, the numbers may be modified as may be suitable for a desired application.

In FIG. 2B, the movable elements 214A-214F are illustrated as rotatable shelves, but this configuration is not mean to be limiting. More generally, the movable elements 214A-214F may include elements subject to translation, rotation, or any combination thereof between a closed position in which the panels 202 are selectively retained at the frame 204, and an open position in which the panels 202 may drop away from the frame 204, e.g., toward the floor. Due to the specific implementation illustrated in FIG. 2B, the movable elements 214A-214F may be hereinafter referred to as rotatable shelves 214A-214F (collectively "rotatable shelves 214").

In some embodiments, each of the end supports 210 and/or the cross beams 212 may include extruded aluminum. Alternately or additionally, each of the end supports 210 and/or the cross beams 212 may include other materials instead of or in addition to aluminum and/or may be made according to other manufacturing techniques instead of or in addition to extrusion.

In embodiments in which the end supports 210 and/or the cross beams 212 are extruded and/or in other embodiments, the frame 204 may additionally include one or more inserts 216A-216F (collectively "inserts 216") configured to couple the end supports 210 and the cross beams 212 together. For example, one end of the insert 216A may be received in a slot 218 running the length of the first end support 210 while the opposite end of the insert 216A may be received within a cavity 220 running the length of the first cross beam 212A. The insert 216A may be frictionally retained within the slot 218 and/or the cavity 220, and/or one or more screws, bolts, pins, or other fasteners may be used to further couple the insert 216A to the first end support 210 and the first cross beam 212A. The other inserts 216B-216F may be coupled between the end supports 210 and the cross beams 212 in a similar manner as described for the insert 216A.

As mentioned previously, embodiments described herein may be electronically controlled. For example, as abstractly illustrated in FIG. 3, the drop-away ceiling 104 may further include and/or may be coupled to one or more sensors 302 and a controller 304. The sensor 302 is generally configured to detect smoke, heat, flames, or any combination thereof, or some other environmental condition for which it may be desirable to release the panels 202.

Figure 3:
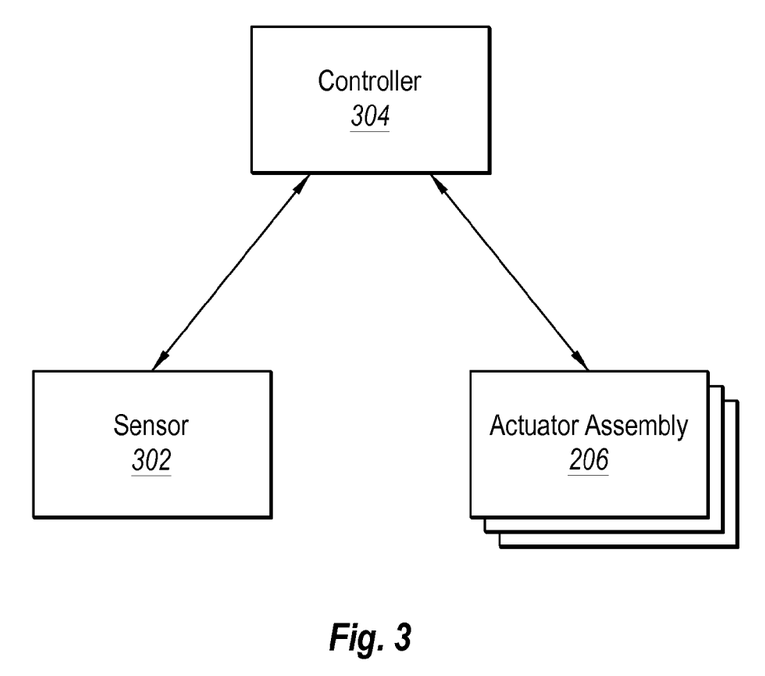
FIG. 3 abstractly illustrates various components that may be included in the drop-away ceiling of FIGS. 2A-2B.

The controller 304 is communicatively coupled to the sensor 302 and to the actuator assemblies 206. The controller 304 is configured to control movement of the rotatable shelves 214 (or other movable elements of the drop-away ceiling 104) between closed positions and open positions in response to one or more sensor signals generated by the sensor 302. For example, in response to a sensor signal from the sensor 302 indicating the presence of smoke, a temperature above a selected threshold, and/or flames (e.g., UV radiation), the controller 304 may send one or more control signals to the actuator assemblies 206. As will be described in more detail below, the actuator assemblies 206 are operatively coupled to at least some of the rotatable shelves 214. Accordingly, and in response to the control signals from the controller 304, the actuator assemblies 206 may operate to move the rotatable shelves 214 to open positions such that the panels 202 can fall away from the frame 204.

The embodiments disclosed herein have been described as being electronically controlled. Alternately or additionally, the drop-away ceiling 104 and/or other drop-away ceilings disclosed herein may include a manual override option to manually release the panels 202 to drop away from the frame 204.

Alternately or additionally, the drop-away ceiling 104 may include one or more manually controlled or electronically controlled levers or pins for testing. In more detail, the lever(s) or pin(s) may be rotatably or slidably coupled to a portion of the frame 204, or otherwise coupled to the frame 204. The lever(s) or pin(s) may be movable between a non-test position and a test position. In the non-test position, the lever(s) or pin(s) may not interfere with the panels 202 and the drop-away ceiling 104 may be operated as described herein. The lever(s) or pin(s) may be rotated, slid, or otherwise moved to the test position in which the lever(s) or pin(s) retain the panels 202 suspended within the frame 204 above the floor even when the rotatable shelves 214 are opened and/or even when the actuator assemblies 206 are actuated. Such a feature may be desired in environments including data centers in which it is necessary or desired to routinely verify that the drop-away ceiling 104 is functioning properly. In particular, prior to testing that the actuator assemblies 206 are functioning properly, the lever(s) or pin(s) may be moved to the test position. Then, the actuator assemblies 206 may be operated to test for proper electronic and/or mechanical function. With the lever(s) or pin(s) in the test position, the panels 202 remain suspended above the floor during the testing of the actuator assemblies 206 even when the actuator assemblies 206 are actuated (which would otherwise result in the panels 202 dropping away from the frame 204). Thus, the panels 202 do not fall to the floor during testing and do not have to be picked up and reset within the drop-away ceiling 104 after testing. When the testing is completed, the lever(s) or pin(s) may be moved back to the non-test position such that the panels 202 may drop away from the frame 204 without interference from the lever(s) or pin(s) if the actuator assemblies 206 are operated accordingly.

Figure 4:
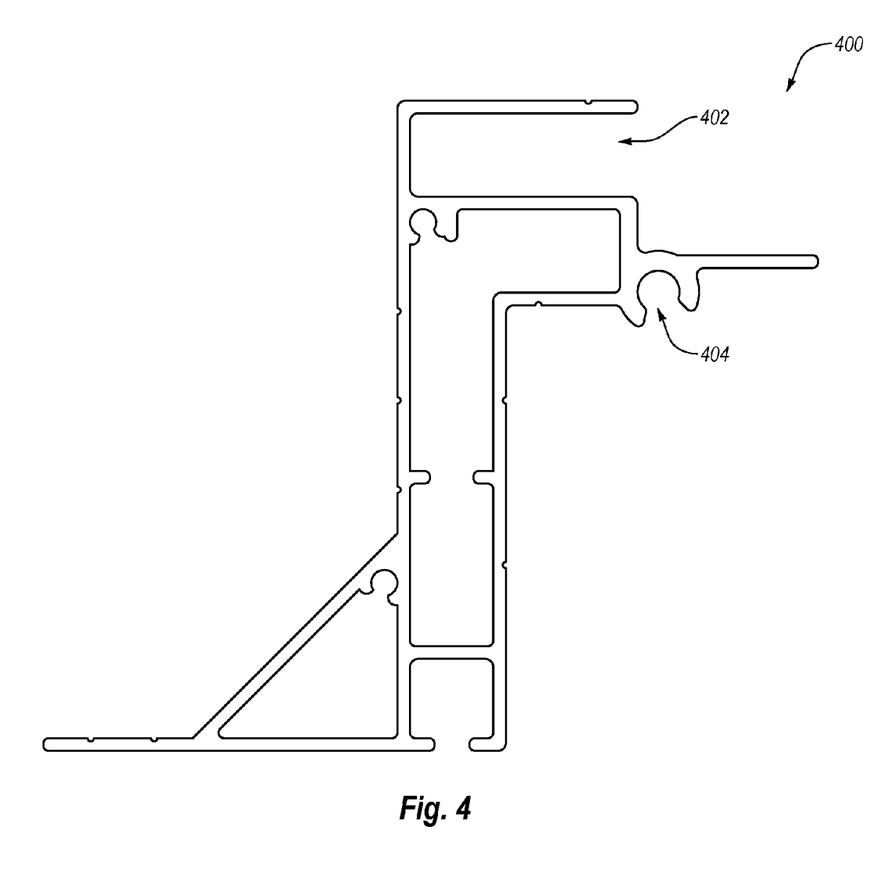
FIG. 4 is an end view of an example end support such as may be implemented in the drop-away ceiling of FIGS. 2A-2B.

FIG. 4 is an end view of an example end support 400 that may correspond to the end supports 210 of FIG. 2B. As illustrated, the end support 400 includes a slot 402 running the length of the end support 400. The slot 402 may correspond to the slot 218 of FIG. 2B, for instance.

The end support 400 additionally includes a hinge seat 404. The hinge seat 404 is a semi-cylindrical hinge seat substantially running the length of the end support 400 in some embodiments. In general, the hinge seat 404 is configured to receive a hinge member of a rotatable shelf, the hinge member having a shape that is complementary to the shape of the hinge seat 404. For instance, the hinge member may include a rod-like member configured to be received in the hinge seat 404 such that the hinge seat 404 and the hinge member collectively form a semi-cylindrical hinge defining an axis of rotation parallel to the length of the end support 400 and about which the rotatable shelf may rotate, such that the rotatable shelf is rotatably coupled to the end support 400.

Figure 5:
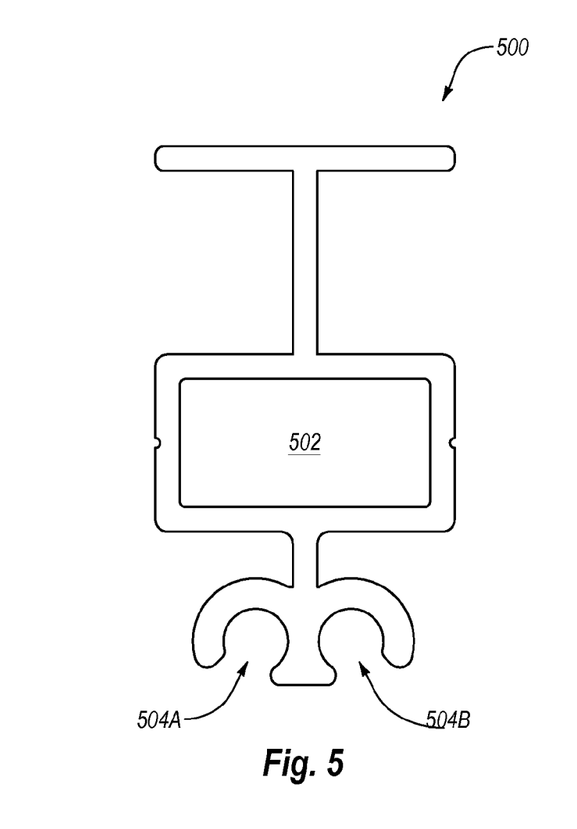
FIG. 5 is an end view of an example cross beam such as may be implemented in the drop-away ceiling of FIGS. 2A-2B.

FIG. 5 is an end view of an example cross beam 500 that may correspond to the cross beams 212 of FIG. 2B. As illustrated, the cross beam 500 defines a cavity 502 running the length of the end support 500. The cavity 502 may correspond to the cavity 220 of FIG. 2B, for instance.

The cross beam 500 additionally includes hinge seats 504A, 504B (collectively "hinge seats 504"). The hinge seats 504 are similar in form and function to the hinge seat 404. In particular, the hinge seats 504 are each configured to receive a hinge member of a corresponding rotatable shelf such that each corresponding rotatable shelf may be rotatably coupled to the cross beam 500.

Figure 6:
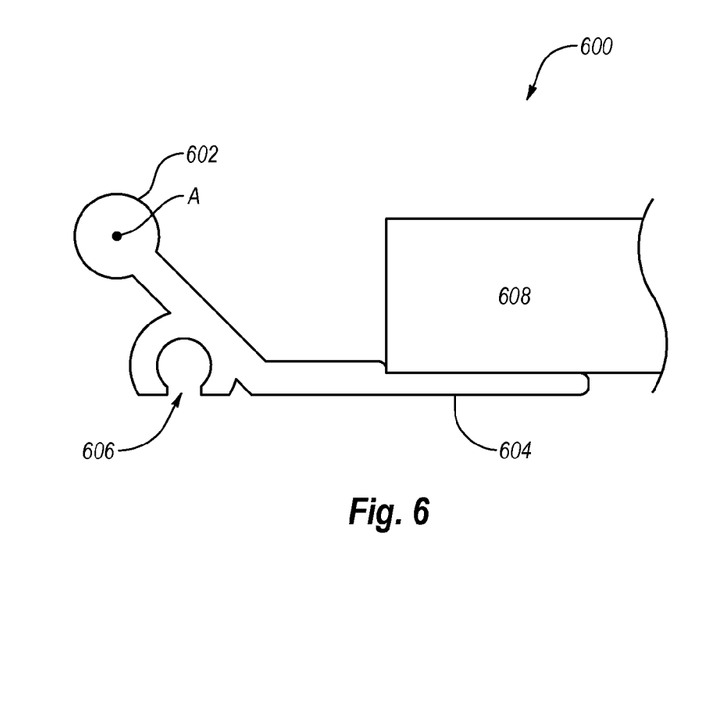
FIG. 6 is an end view of an example rotatable shelf such as may be implemented in the drop-away ceiling of FIGS. 2A-2B.

FIG. 6 is an end view of an example rotatable shelf 600 that may correspond to the rotatable shelves 214 of FIG. 2B. As illustrated, the rotatable shelf 600 includes a hinge member 602 substantially running a length of the rotatable shelf 600. In particular, the hinge member 602 is a rod-like member configured to be received in a hinge seat, such as any of the hinge seats 404, 504 of FIGS. 4-5, such that the rotatable shelf 600 is rotatably coupled to a corresponding one of the end support 400 or the cross beam 500.

The rotatable shelf 600 additionally includes a support member 604 and a pivot point 606. The support member 604 substantially runs the length of the rotatable shelf 600 and is configured to support a panel edge 608 of a panel which may correspond to the panels 202 of FIGS. 2A-2B. In use and in a closed position as illustrated in FIG. 6, the rotatable shelf 600 may substantially be oriented as illustrated such that the panel edge 608 is supported by the support member 604 and is prevented from falling downward.

In some embodiments, an actuator assembly, such as one of the actuator assemblies 206 of FIGS. 2A-2B, may be pivotally coupled to the rotatable shelf 600 at the pivot point 606. Further, the pivot point 606 is offset from the hinge member 602, and is thus offset from an axis of rotation A of the rotatable shelf 600 that is defined by and in the hinge member 602. Accordingly, with appropriate movement of the actuator assembly, the rotatable shelf 600 may rotate clockwise (at least in the view of FIG. 6) about the axis A until the panel edge 608 is released to drop away.

Figure 7A:
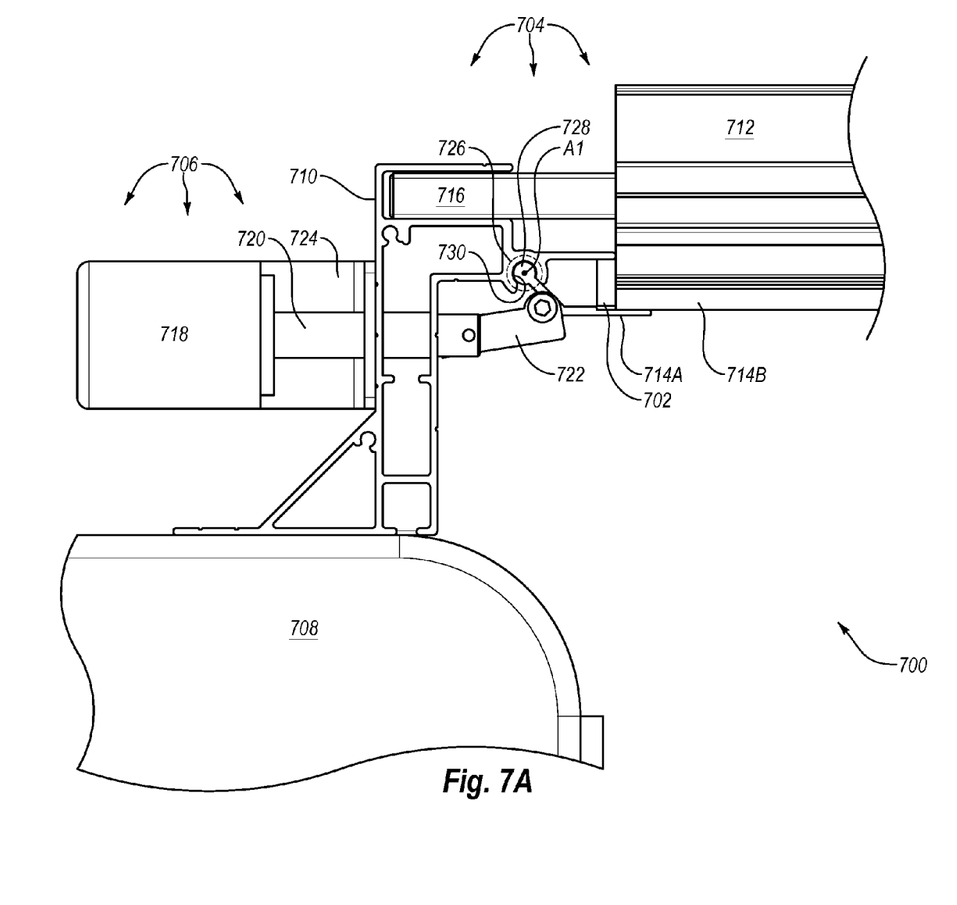
FIGS. 7A and 7B are detail side views of a portion of an example drop-away ceiling that may correspond to the drop-away ceiling of FIGS. 2A-2B.
Figure 7B:
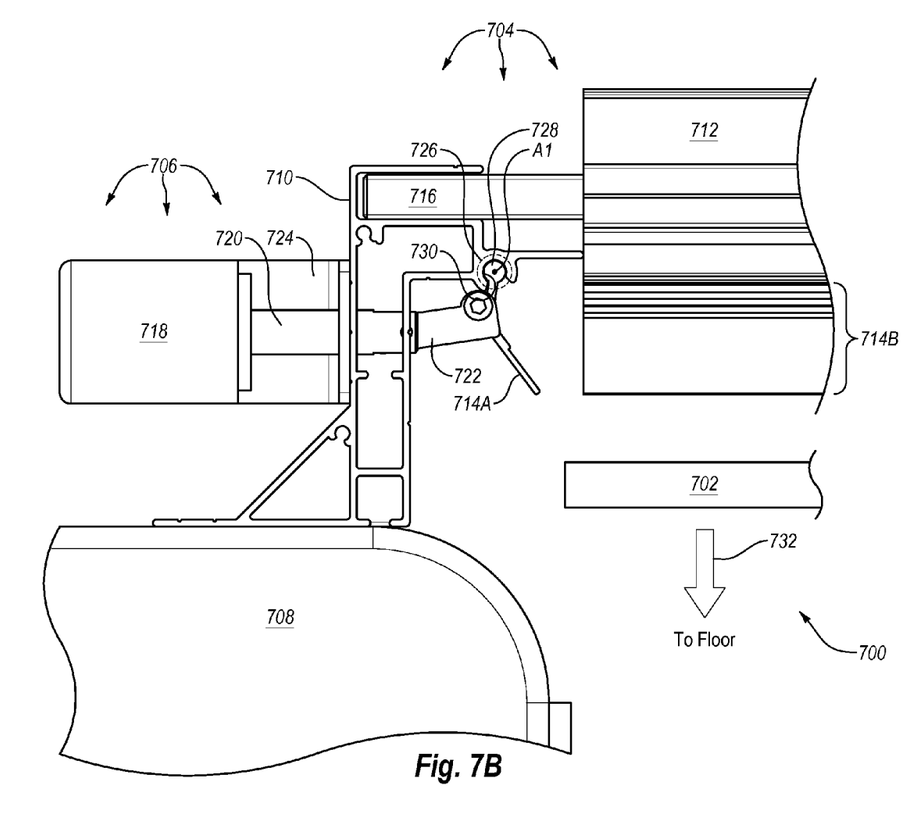

FIGS. 7A and 7B are detail side views of a portion of a drop-away ceiling 700 that may correspond to the drop-away ceiling 104 described herein. The drop-away ceiling 700 may generally include the same components and may be configured in a similar manner as the drop-away ceiling 104 described above, notwithstanding some differences. For example, similar to the drop-away ceiling 104, the drop-away ceiling 700 of FIGS. 7A-7B includes a panel 702, a frame generally designated at 704, and one or more actuator assemblies, one of which is generally designated at 706. As illustrated, the frame 704 is resting on a server rack 708. Further, the frame 704 includes a first end support 710 and a second end support (not shown) on an opposite side of the drop-away ceiling 700 and parallel to the first end support 710; a first cross beam 712 and one or more other cross beams (not shown) parallel to the first cross beam 712; a first rotatable shelf 714A rotatably coupled to the first end support 710, a second rotatable shelf (not shown) rotatably coupled to the second end support, a third rotatable shelf 714B rotatably coupled to the first cross beam 712, and one or more other rotatable shelves (not shown) rotatably coupled to corresponding cross beams (the various rotatable shelves may be collectively referred to herein as "rotatable shelves 714"); and one or more inserts 716.

The actuator assembly 706 is operatively coupled to the rotatable shelf 714A. Generally, the actuator assembly 706 is configured to selectively rotate the rotatable shelf 714A between a closed position (FIG. 7A) and an open position (FIG. 7B). In more detail, and in the illustrated embodiment, the actuator assembly 706 includes a solenoid 718, a solenoid rod 720, a linkage arm 722, and a mounting bracket 724. The mounting bracket 724 is configured to mount the actuator assembly 706 to the first end support 710. The solenoid 718 is configured to selectively extend the solenoid rod 720 out of the solenoid 718 or retract the solenoid rod 720 into the solenoid 718. Thus, in the arrangement of FIGS. 7A-7B, the solenoid rod 720 is configured for translational movement tangential to a circle concentric with an axis of rotation A1 of the rotatable shelf 714A. The linkage arm 722 has a first end pivotally coupled to an end of the solenoid rod 720, and a second end pivotally coupled to the rotatable shelf 714A at a pivot point (not visible in FIGS. 7A-7B) displaced from the axis of rotation A1. In such a configuration, translational movement of the solenoid rod 720 causes rotational movement of the rotatable shelf 714A.

Although not shown in FIGS. 7A-7B, the drop-away ceiling 700 may further include one or more sensors and/or a controller, such as the sensor 302 and/or the controller 304 described above.

According to some embodiments, a semi-cylindrical hinge 726 is formed between the rotatable shelf 714A and the first end support 710. The semi-cylindrical hinge 726 is formed by a hinge member 728 of the rotatable shelf 714A and a hinge seat 730 of the first end support 710, the hinge member 720 being seated within the hinge seat 730.

In some embodiments, only one or both of the first rotatable shelf 714A and the second rotatable shelf (not shown) are operatively coupled to one or more corresponding actuator assemblies 706 (only one is shown in FIGS. 7A-7B), while others of the rotatable shelves (such as the third rotatable shelf 714B) are not operatively coupled to a corresponding actuator assembly. For example, the drop-away ceiling 700 may have, e.g., four actuator assemblies 706 similar to the drop-away ceiling 104 described above. In these and other embodiments, the third rotatable shelf 714B and other rotatable shelves (not shown) that are parallel to the third rotatable shelf 714B are not operatively coupled to a corresponding actuator assembly 718. Instead, for example, and as illustrated in FIG. 7A, the third rotatable shelf 714B may be positioned above the first rotatable shelf 714A such that the third rotatable shelf 714B is retained in a closed position by the first rotatable shelf 714A when the first rotatable shelf 714A is also in the closed position. The first rotatable shelf 714A may similarly retain the other rotatable shelves parallel to the third rotatable shelf 714A in the closed position. The second rotatable shelf may cooperate with the first rotatable shelf 714A to retain the third rotatable shelf 714A and the other rotatable shelves in the closed position by being positioned below the third rotatable shelf 714A and the other rotatable shelves when in the closed position. Thus, the third rotatable shelf 714B and the other rotatable shelves cooperate with the first rotatable shelf 714A and the second rotatable shelf to selectively retain or release the panel 702 without the third rotatable shelf 714B and the other rotatable shelves being operatively coupled to a corresponding actuator assembly.

When the first rotatable shelf 714A and the second rotatable shelf are moved to the open position by the corresponding actuator assemblies 706, however, the third rotatable shelf 714B and the other rotatable shelves are no longer retained in the closed position and can rotate to open positions as illustrated in FIG. 7B. More particularly, the weight of the panel 702 may be sufficient to cause the third rotatable shelf 714B and the other rotatable shelves to rotate to open positions and out of the way of the panel 702 such that the panel 702 can drop away from the drop-away ceiling 700, e.g., towards the floor as indicated by the arrow 732.

Referring back to FIG. 2B, the rotatable shelves 214 may be operated in a similar manner to the rotatable shelves 714 as described with respect to FIGS. 7A-7B to allow the panels 202 to drop away from the drop-away ceiling 700.

Although the drop-away ceilings 104 and 700 disclosed herein have generally been described as including two panels 202, 702 and four actuator assemblies 206, 706, more generally, the drop-away ceilings 104, 700 may include more or fewer than two panels 202, 702 and/or more or fewer than four actuator assemblies 206, 706. For example, in an embodiment described now with respect to FIGS. 7A-7B, only one rotatable shelf is operatively coupled to an actuator assembly to control a ceiling section containing up to four panels.

In this and other embodiments, the first rotatable shelf 714A may be operatively coupled to a single actuator assembly, such as the actuator assembly 706 illustrated in FIGS.

7A-7B, to control a ceiling section including four panels. The actuator assembly 706 may be the only actuator assembly in this example. The first rotatable shelf 714A may be sufficiently long to support a collective total of four substantially collinear edges of four panels 702 in this example. Further, the third rotatable shelf 714B and seven other rotatable shelves parallel to the third rotatable shelf 714B may rest on the first rotatable shelf 714A, as is illustrated in FIG. 7A with respect to the third rotatable shelf 714B, to support a collective total of eight parallel edges of the four panels 702 in this example. The second rotatable shelf (not shown) that is parallel to the first rotatable shelf 714A may rest on one or more of the third rotatable shelf 714B and the seven other rotatable shelves to support a collective total of four substantially collinear edges of the four panels 702 opposite the four substantially collinear edges that are supported by the first rotatable shelf 714A. Accordingly, when the single actuator assembly 706 moves the first rotatable shelf 714A to the open position, the third rotatable shelf 714B and the seven other rotatable shelves parallel thereto are released to move to open positions under the weight of the panels 702. Moreover, the opening of the third rotatable shelf 714B and/or the seven other rotatable shelves similarly releases the second rotatable shelf to move to the open position under the weight of the panels 702, which are then free to drop away as the rotatable shelves 714 move to open positions. The foregoing example may simplify the electrical configuration and reduces the cost of the drop-away ceiling 700 by using a single actuator assembly 706, as compared to embodiments in which multiple actuator assemblies 706 are used.

Modifications, additions, or omissions may be made to FIGS. 7A and 7B without departing from the scope of the invention. For example, the actuator assembly 706 including the solenoid 718 and other components is one example of a release mechanism that can be implemented to release the panel 702 from the drop-away ceiling 700. Alternately or additionally, the drop-away ceiling may include one or more other release mechanisms that may include one or more of magnet, springs, manual release, hydraulics, air actuators, or other suitable release mechanisms.

A method of operating a drop-away ceiling, such as the drop-away ceilings 104 and 700, will now be described. The method may include an actuator assembly, such as the actuator assembly 206 or 706, retaining a movable element, such as the rotatable shelf 214A or 714A, in a closed position that is effective to suspend a ceiling panel, such as the panels 202 and 702, above the floor. Alternately or additionally, the method may include a release mechanism retaining the movable element in the closed position, where the release mechanism includes one or more of a solenoid, an actuator assembly, magnets, springs, manual release, hydraulics, air actuators, or other release mechanisms.

The method of operating the drop-away ceiling may also include receiving a sensor signal indicative of an environmental parameter within an environment of the drop-away ceiling. For example, the sensor signal may be generated by the sensor 302 and received by the controller 304. The method may include determining that the sensor signal satisfies a particular criterion. The determination may be made by the controller 304.

Receiving the sensor signal indicative of the environmental parameter within the environment of the drop-away ceiling may include receiving a sensor signal indicative of smoke within the environment of the drop-away ceiling. Determining that the sensor signal satisfies the particular criterion may include determining that the sensor signal indicates an amount of smoke above a particular threshold amount of smoke.

Alternately or additionally, receiving the sensor signal indicative of the environmental parameter within the environment of the drop-away ceiling may include receiving a sensor signal indicative of a temperature within the environment of the drop-away ceiling. Determining that the sensor signal satisfies the particular criterion may include determining that the sensor signal indicates that the temperature within the environment of the drop-away ceiling is above a particular temperature threshold.

Alternately or additionally, receiving the sensor signal indicative of the environmental parameter within the environment of the drop-away ceiling may include receiving a sensor signal indicative of UV radiation within the environment of the drop-away ceiling. Determining that the sensor signal satisfies the particular criterion may include determining that the sensor signal indicates that the UV radiation within the environment of the drop-away ceiling is above a particular UV radiation threshold.

The method of operating the drop-away ceiling may also include, in response to the sensor signal satisfying the particular criterion, the actuator assembly moving the movable element to an open position that is effective to release the ceiling panel to fall downward, e.g., toward the floor. The ceiling panel may fall all the way to the floor or part way to the floor and/or may be at least partially suspended by a lanyard coupled between the frame and the ceiling panel. In these and other embodiments, the actuator assembly moving the movable element to the open position may include the solenoid 718 retracting the solenoid arm 720 and the linkage arm 722 and the linkage arm 722 rotating the rotatable shelf 714A about the axis of rotation A1 from the closed position to the open position as the linkage arm 722 is retracted.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A mechanical drop-away ceiling comprising:
   a frame configured to be suspended above a floor, the frame including a rotatable shelf rotatable between a closed position and an open position;
   a panel selectively retained at the frame by the rotatable shelf in the closed position and free to drop away from the frame when the rotatable shelf is in the open position; and
   an actuator assembly mounted to the frame and operatively coupled to the rotatable shelf, the actuator assembly configured to selectively rotate the rotatable shelf between the closed position and the open position, wherein:

the rotatable shelf is configured to rotate about an axis of rotation; and the actuator assembly includes:
a solenoid;
a solenoid rod extending from the solenoid; and
a linkage arm having a first end pivotally coupled to an end of the solenoid rod and a second end pivotally coupled to the rotatable shelf at a pivot point displaced from the axis of rotation.

2. The mechanical drop-away ceiling of claim 1, further comprising:
a sensor configured to detect smoke, heat, flames, or any combination thereof; and
a controller communicatively coupled to the sensor, the controller configured to electronically control movement of the rotatable shelf between the closed position and the open position in response to sensor signals generated by the sensor.

3. The mechanical drop-away ceiling of claim 1, wherein the panel comprises a thermosensitive material.

4. The mechanical drop-away ceiling of claim 1, further comprising a lanyard having a first end coupled to the frame and a second end coupled to the panel, wherein the lanyard is configured to arrest downward motion of the panel after the panel falls away from the frame.

5. The mechanical drop-away ceiling of claim 1, wherein the frame further comprises additional rotatable shelves each rotatable between an open position and a closed position, wherein:
a first one of the additional rotatable shelves is retained in its closed position by the rotatable shelf when the rotatable shelf is in its closed position;
the first one of the additional rotatable shelves is free to move to its open position when the rotatable shelf is in its open position.

6. The mechanical drop-away ceiling of claim 5, wherein the actuator assembly is the only actuator assembly included in the mechanical drop-away ceiling and selective rotation by the actuator assembly of the rotatable shelf to its open position allows the additional rotatable shelves to rotate to their open positions.

7. A mechanical drop-away ceiling comprising:
a frame configured to be suspended above a floor, the frame including a first rotatable shelf rotatable between a closed position and an open position;
a panel selectively retained at the frame by the first rotatable shelf in the closed position and free to drop away from the frame when the first rotatable shelf is in the open position;
an actuator assembly mounted to the frame and operatively coupled to the first rotatable shelf, the actuator assembly configured to selectively rotate the first rotatable shelf between the closed position and the open position; and
a second rotatable shelf rotatable about a second axis that is orthogonal to the first axis, wherein:
the second rotatable shelf is rotatable between a first position and a second position;
the panel is retained at the frame by the second rotatable shelf in the first position;
when the first rotatable shelf is in the closed position, the second rotatable shelf is retained by the first rotatable shelf in the first position such that the second rotatable shelf cooperates with the first rotatable shelf to retain the panel at the frame; and
when the first rotatable shelf is in the open position such that the second rotatable shelf is not retained in the first position by the first rotatable shelf, a weight of the panel is sufficient to move the second rotatable shelf to the second position such that the panel may drop away from the frame.

8. The mechanical drop-away ceiling of claim 7, further comprising:
a sensor configured to detect smoke, heat, flames, or any combination thereof; and
a controller communicatively coupled to the sensor and to the actuator assembly, the controller configured to control the actuator assembly in response to sensor signals generated by the sensor.

9. The mechanical drop-away ceiling of claim 7, wherein the frame further includes:
a first end support configured to rest on a first structure defining one side of an open volume, the first rotatable shelf being rotatably coupled to the first end support;
a second end support substantially parallel to the first end support and configured to rest on a second structure defining an opposite side of the open volume;
a third rotatable shelf rotatably coupled to the second end support;
a first cross beam coupled between the first end support and the second end support;
the second rotatable shelf rotatably coupled to the first cross beam;
a second cross beam spaced apart from the first cross beam and coupled between the first end support and the second end support; and
a fourth rotatable shelf rotatably coupled to the second cross beam.

10. The mechanical drop-away ceiling of claim 9, wherein the actuator assembly is a first actuator assembly mounted to the first end support and is mechanically coupled to a first end of the first rotatable shelf, the mechanical drop-away ceiling further comprising:
a second actuator assembly mounted to the first end support and operatively coupled to a second end of the first rotatable shelf, the second actuator assembly configured to cooperate with the first actuator assembly to selectively rotate the first rotatable shelf between the closed position and the open position;
a third actuator assembly mounted to the second end support and operatively coupled to a first end of the third rotatable shelf; and
a fourth actuator assembly mounted to the second end support and operatively coupled to a second end of the third rotatable shelf, the third and fourth actuator assemblies configured to cooperate to selectively rotate the third rotatable shelf between the first position and the second position, wherein the first position is a closed position and the second position is an open position.

11. The mechanical drop-away ceiling of claim 10, wherein:
the first, second, third, and fourth rotatable shelves cooperate to selectively retain the panel at the frame;
the first and third rotatable shelves partially underlap each of the second and fourth rotatable shelves to selectively retain the second and fourth rotatable shelves in closed positions; and
when the first and third rotatable shelves are in open positions such that the second and fourth rotatable shelves are not retained in closed positions, a weight of the panel is sufficient to move the second and fourth rotatable shelves to open positions such that the panel may drop away from the frame.

12. The mechanical drop-away ceiling of claim 7, wherein the panel comprises a thermosensitive material.

13. The mechanical drop-away ceiling of claim 7, further comprising a lanyard having a first end coupled to the frame and a second end coupled to the panel, wherein the lanyard is configured to arrest downward motion of the panel after the panel falls away from the frame.

14. The mechanical drop-away ceiling of claim 7, wherein:
the first rotatable shelf is configured to rotate about an axis of rotation; and
the actuator assembly includes:
a solenoid;
a solenoid rod extending from the solenoid; and
a linkage arm having a first end pivotally coupled to an end of the solenoid rod and a second end pivotally coupled to the first rotatable shelf at a pivot point displaced from the axis of rotation.

15. A mechanical drop-away ceiling comprising:
a frame configured to be suspended above a floor of an aisle, the frame including:
a first end support configured to rest on a server rack defining one side of the aisle;
a first rotatable shelf rotatably coupled to the first end support;
a second end support substantially parallel to the first end support and configured to rest on a second server rack defining an opposite side of the aisle;
a second rotatable shelf rotatably coupled to the second end support;
a first cross beam coupled between the first end support and the second end support;
a third rotatable shelf rotatably coupled to the first cross beam;
a second cross beam spaced apart from the first cross beam and coupled between the first end support and the second end support; and
a fourth rotatable shelf rotatably coupled to the second cross beam;
a panel selectively retained at the frame by the rotatable shelves in closed positions and free to drop away from the frame when the rotatable shelves are in open positions;
an actuator assembly mounted to the first end support and mechanically coupled to the first rotatable shelf;
a sensor configured to detect smoke, heat, flames, or any combination thereof; and
a controller communicatively coupled to the sensor and to the actuator assembly, the controller configured to control the actuator assembly in response to sensor signals generated by the sensor, the actuator assembly operable to rotate the first rotatable shelf between the closed position and the open position.

16. The mechanical drop-away ceiling of claim 15, wherein the third and fourth rotatable shelves are retained in closed positions by the first rotatable shelf in the closed positioned and the second rotatable shelf is retained in a closed position by the third and/or fourth rotatable shelves in closed positions such that moving the first rotatable shelf to the open position releases the third and fourth rotatable shelves to move to the open position, which in turn releases the second rotatable shelf to move to the open position.

17. The mechanical drop-away ceiling of claim 15, wherein the panel comprises a thermosensitive material.

18. The mechanical drop-away ceiling of claim 15, further comprising a lanyard having a first end coupled to the frame and a second end coupled to the panel, wherein the lanyard is configured to arrest downward motion of the panel after the panel falls away from the frame.

19. The mechanical drop-away ceiling of claim 15, wherein:
the first rotatable shelf is configured to rotate about an axis of rotation; and
the actuator assembly includes:
a solenoid;
a solenoid rod extending from the solenoid; and
a linkage arm having a first end pivotally coupled to an end of the solenoid rod and a second end pivotally coupled to the first rotatable shelf at a pivot point displaced from the axis of rotation.

\* \* \* \* \*